United States Patent
Meyer

(10) Patent No.: US 6,571,204 B1
(45) Date of Patent: May 27, 2003

(54) BUS MODELING LANGUAGE GENERATOR

(75) Inventor: James W. Meyer, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/128,704

(22) Filed: Aug. 4, 1998

(51) Int. Cl.[7] .............................. G06F 3/00; G01R 31/28
(52) U.S. Cl. .............................. 703/22; 703/20; 703/26; 703/14; 714/742; 714/735
(58) Field of Search ............................ 703/14, 20, 22, 703/26; 712/32, 225; 714/739, 742, 735

(56) References Cited

U.S. PATENT DOCUMENTS

| | | | | |
|---|---|---|---|---|
| 5,600,579 A | * | 2/1997 | Steinmetz, Jr. .............. 364/578 |
| 5,669,000 A | * | 9/1997 | Jessen et al. ............... 395/704 |
| 5,726,918 A | * | 3/1998 | Giramma et al. ............ 364/578 |
| 5,841,967 A | * | 11/1998 | Sample et al. .......... 395/183.09 |
| 5,872,909 A | * | 2/1999 | Wilner et al. ........... 395/183.14 |
| 5,966,306 A | * | 10/1999 | Nodine et al. ........... 364/468.28 |
| 6,006,166 A | * | 12/1999 | Meyer ......................... 702/119 |
| 6,058,492 A | * | 5/2000 | Sample et al. ................ 714/33 |
| 6,076,180 A | * | 6/2000 | Meyer .......................... 714/742 |
| 6,182,258 B1 | * | 1/2001 | Hollander ................... 714/739 |

* cited by examiner

*Primary Examiner*—Kevin J. Teska
*Assistant Examiner*—T. Phan

(57) ABSTRACT

The present invention includes simulation system devices and methods. The invention can be used to collect information describing a desired data exchange between simulated devices and can assist in the generation of simulation model control programs that implement the desired data exchange. The disclosed methods feature generating simulation control code by interacting with a user to receive an address constraint and by generating a collection of data transfer instructions. Each data transfer instruction includes a data transfer address selected from a collection of addresses. The disclosed systems feature a simplified simulation data entry system including means for receiving address constraint information delimiting a collection of data transfer address values and means for generating a collection of simulation data transfer instructions. Each data transfer instruction may include an address selected from the collection of data transfer address values.

27 Claims, 13 Drawing Sheets

```
constant PASSCOUNT                      := 36
variable adr0,loopcnt,datapat;
main
begin ---------------------------------------------------------------
   -- Set flags
   control_flags(cache_dsb, write_thru_enb);
   print(none, no_dp_check);

--************************************************
--          WRITE A RANGE OF MAIN MEMORY ADDRESSES   *
--************************************************
--   adr0 := x"20000";
     adr0 := x"00000";
     loopcnt := 0;
     datapat := 0;
     while (loopcnt < PASSCOUNT) loop
         write(MEM, addr => adr0, data_value => datapat, byte_cnt => 8);
         loopcnt := loopcnt + 1;
         adr0 := adr0 + 8;
         datapat := datapat + 1;
     end loop;

idle(40);

--************************************************
--             VERIFY MEMORY RANGE WRITTEN                *
--************************************************
--   adr0 := x"20000";
     adr0 := x"00000";
     loopcnt := 0;
     datapat := 0;
     while (loopcnt < PASSCOUNT) loop
         read (MEM, addr => adr0, data_value => datapat, byte_cnt => 8);
         loopcnt := loopcnt + 1;
         adr0 := adr0 + 8;
         datapat := datapat + 1;
     end loop;

HALT;
     sleep(0);

end;
```

Fig. 3

Address Ranges

| | Max | Min | Cacheable | IDE | Lockable | I/O | PCI | Probability |
|---|---|---|---|---|---|---|---|---|
| 1) | 001FF5FF | 001FE500 | ☒ | ☐ | ☐ | ☐ | ☐ | 25 |
| 2) | 40FFFFFF | 40000000 | ☐ | ☐ | ☐ | ☐ | ☒ | 25 |
| 3) | 42FFFFFF | 42100000 | ☐ | ☐ | ☐ | ☐ | ☒ | 0 |
| 4) | 000002EF | 00000200 | ☐ | ☐ | ☐ | ☒ | ☒ | 25 |
| 5) | 00000BFF | 00000800 | ☐ | ☐ | ☐ | ☒ | ☒ | 0 |
| 6) | 00000FFF | 00000C00 | ☐ | ☐ | ☐ | ☒ | ☒ | 0 |
| 7) | 4FFFFFFF | 40000000 | ☐ | ☐ | ☐ | ☐ | ☐ | 25 |
| 8) | 001FFFFF | 001FF600 | ☐ | ☒ | ☐ | ☒ | ☐ | 0 |
| 9) | 00000000 | 00000000 | ☐ | ☐ | ☐ | ☐ | ☐ | 0 |
| 10) | 00000000 | 00000000 | ☐ | ☐ | ☐ | ☐ | ☐ | 0 |

OK   Cancel

| PCI Master Properties | | | | |
|---|---|---|---|---|
| | Bus Utilization | Hang Timer | 64 Bit Ops | # of Data Areas | |
| PCI 1 Master 0 | 50 | 25 | ☐ | 2 | ...Details |
| PCI 1 Master 1 | 50 | 25 | ☐ | 0 | ...Details |
| PCI 2 Master 0 | 50 | 25 | ☐ | 0 | ...Details |
| PCI 2 Master 1 | 50 | 25 | ☐ | 0 | ...Details |

OK  Cancel

Fig. 7

BUS MODELING LANGUAGE GENERATOR

BACKGROUND INFORMATION

Computer systems combine numerous complex electronic components to achieve high-speed processing and manipulation of data. The reliable operation of such a system requires consistent and predictable behavior by each component of the system. For example, electrical signals exchanged between the components must be within set voltage and timing constraints.

When a new computer is developed, combinations of new or relatively unproven components may be used. To ensure that components work together properly, a software-implemented design simulation may be used. Design simulations can include programmable representations of various computer system hardware components. These programmable representations are commonly referred to as bus functional models (BFMs). BFMs can be used to model the behavior of, for example, a microprocessor, a peripheral bus, a memory chip, or a hard disk drive. By simulating components using BFMs, problems with a design can be identified before a physical realization is developed.

SUMMARY

The present invention includes a device simulation system that can collect information describing a desired data exchange between simulated devices and can assist in the generation of simulation model control programs that implement the desired data exchange. For example, an engineer may wish to test the interaction between components of a computer system that are being designed. The engineer may use a simulation system including programmable simulation models. Using the present invention, simulation model control programs can be automatically generated to realize a desired simulation.

In one embodiment, the invention features a computer-implemented method of generating simulation code. The method includes interacting with a user to receive an address constraint. The address constraint designates a collection of addresses at an interface of a simulation model. Additionally, the method includes generating a collection of data transfer instructions. Each data transfer instruction includes a data transfer address selected from the collection of addresses.

Implementations of the invention may include one or more of the following features. Processing of a data transfer instruction by a simulation model may produce a transfer of data from the simulation model to a second simulation model. The address constraint may include a collection of address ranges and may include address range probability data. The probability data may designate a probability of selection of each of the address ranges. Selection of a data transfer address may include selecting an address range and an address within the address range. The method may also include generating a collection of data retrieval instructions. Each data retrieval instruction may include a data retrieval address selected from the collection of addresses. A simulation model processing a data retrieval instruction may simulate a bus transfer command effecting a data transfer from a second simulation model. The simulation model may be a bus functional model and may include a software-implemented interface to a model of a device under test.

In general, in another embodiment, the invention features a computer-implemented simulation method. The method includes data input means for receiving address range constraint information from a user, means for generating a collection of simulation model data output instructions, and means for generating a collection of simulation model data input instructions. Each data output instruction includes a destination address at an interface of the model. Each data input instructions includes a transfer address accessible at the interface of the model.

Implementations of the invention may include one or more of the following features. The method may include producing a modeling language program file. The program file may include the collection of data output instructions and the collection of data input instructions. The data output instructions and the data input instructions may be interspersed. Each transfer addresses may match a destination address of a generated data output instruction.

In general, in another embodiment, the invention features a computer program residing on a computer-readable medium. The program includes instructions for causing a computer to interact with a user to receive address constraint information that designates a collection of addresses at an interface of a simulation model. The program also includes instructions to generate a collection of simulation model data transfer instructions. Each data transfer instruction includes a data transfer address selected from the collection of addresses.

Implementations of the invention may include one or more of the following features. The computer program may include instructions for causing the computer to generate a collection of data retrieval instructions. Each data retrieval instruction may include a data retrieval address selected from the collection of addresses.

In general, in another embodiment, the invention features a simplified simulation data entry system. The system includes means for receiving address constraint information delimiting a collection of data transfer address values and means for generating a collection of simulation data transfer instructions. Each data transfer instruction may include an address selected from the collection of data transfer address values.

Implementations of the invention may include one or more of the following features. An address range constraint may include a collection of address ranges. Each address range may be bounded by a minimum and a maximum value. An address range constraint may also include address range probability data. The means for generating data transfer instructions may include means for selecting an address from the collection based on the address range probability data. The system may include means for receiving a bus transaction constraint, the bus transaction constraint designating a minimum and a maximum number of bytes that a simulation model can transfer in bus data transfer transaction. The system may also include means for receiving a collection of device constraints. The device constraints may designate data transfer characteristics of a simulated device. The means for generating may include means for generating in accordance with the device constraints.

Implementations of the invention may include one or more of the following advantages. Simulation control programs may be generated using a simplified interface. Control programs for numerous simulated models may be simultaneously generated and their interactions may be coordinated. Other advantages and features will become apparent from the following description and from the claims.

DESCRIPTION OF DRAWINGS

FIG. 3 is a exemplary Bus Functional Modeling Language program.

FIGS. 4–11 illustrate input parameters to a bus functional modeling language generator, according to one embodiment of the invention.

DETAILED DESCRIPTION

Figure 1:
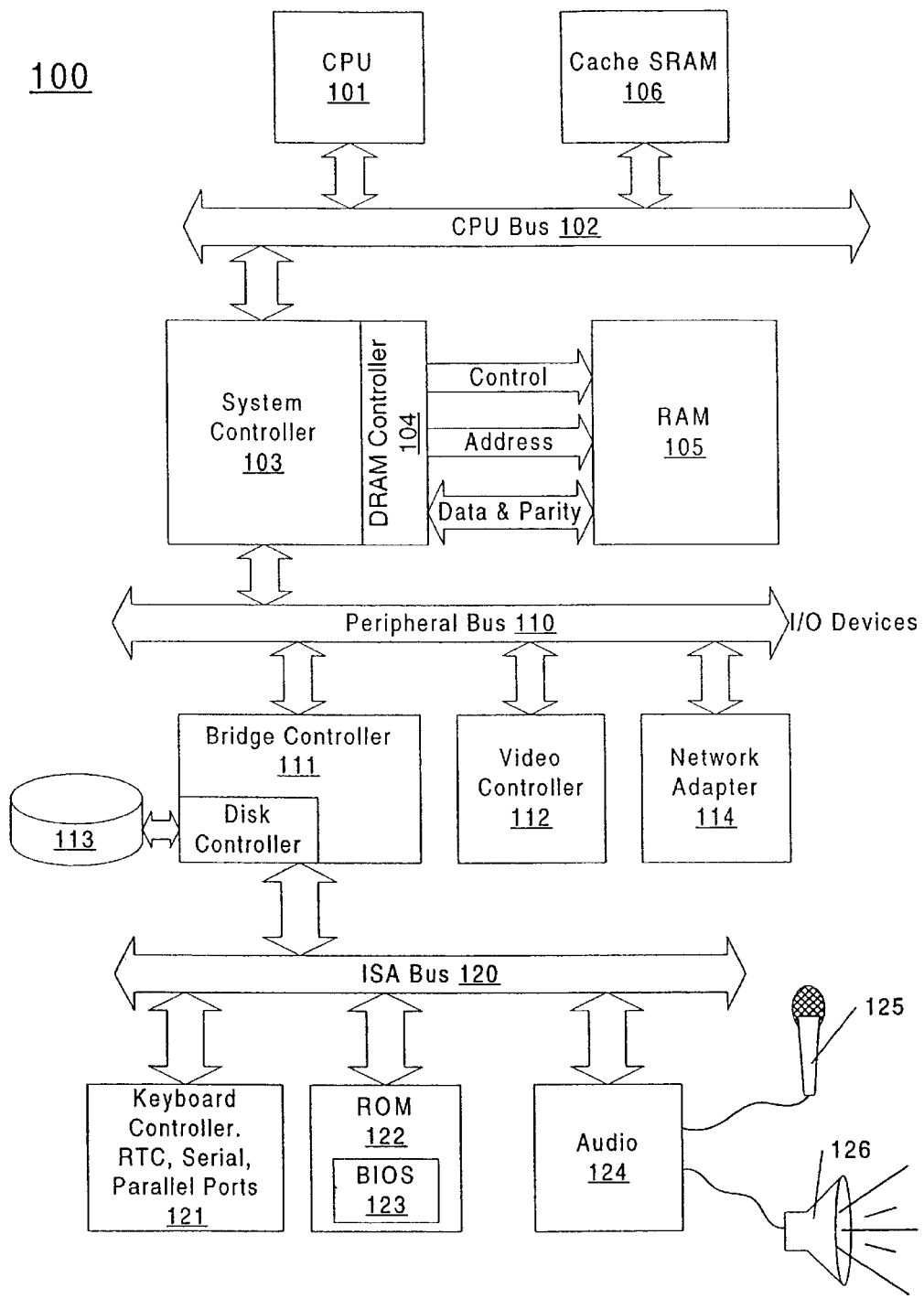
FIG. 1 is an exemplary computer system.

FIG. 1 depicts physical resources of a computer system 100. The system 100 has a central processor 101 connected to a processor host bus 102 over which it provides data, address and control signals. The processors 101 may be any conventional general purpose single- or multi-chip microprocessor such as a Pentium® processor, a Pentium® Pro processor, a Pentium II® processor, a MIPS® processor, a Power PC® processor or an ALPHA® processor. In addition, the processor 101 may be any conventional special purpose microprocessor such as a digital signal processor or a graphics processor.

The microprocessor 101 has conventional address, data, and control lines coupling it to a processor host bus 102. A system controller 103 having an integrated RAM memory controller 104 is connected to the host bus 102 and provides an interface to random access memory 105. The system controller 103 also provides host bus to peripheral bus bridging functions. The controller 103 thereby permits signals on the processor host bus 102 to be compatibly exchanged with signals on a primary peripheral bus 110. The peripheral bus 110 may be, for example, a Peripheral Component Interconnect (PCI) bus, an Industry Standard Architecture (ISA) bus, or a Micro-Channel bus. Additionally, the controller 103 can provide data buffering and data transfer rate matching between the host bus 102 and peripheral bus 110. The controller 103 thereby allows, for example, a processor 101 having a 64-bit 66 MHz interface and a 533 Mbytes/second data transfer rate to interface to a PCI bus 110 having a data path differing in data path bit width, clock speed, or data transfer rate. Computer system accessories including, for example, a video display controller 112 and network controller 114 can be coupled to the peripheral bus 110. The network controller 114 may be, for example, a modem, an Ethernet card, or other network access means.

The system 100 may also include a secondary peripheral bus 120 coupled to the primary peripheral bus 110 through a bridge controller 111. The secondary peripheral bus 120 can be included in the system 100 to provide additional peripheral device connection points or to connect peripheral devices that are not compatible with the primary peripheral bus 110. For example, in the system 100, the secondary bus 120 may be an ISA bus and the primary bus 110 may be a PCI bus. Such a configuration allows ISA devices to be coupled to the ISA bus 120 and PCI devices to be coupled to the PCI bus 110. The bridge controller 111 can also include a hard disk drive control interface to couple a hard disk 113 to the peripheral bus 110.

The computer 100 includes non-volatile ROM memory 122 to store basic computer software routines. ROM 122 may include alterable memory, such as EEPROM (Electronically Erasable Programmable Read Only Memory), to store configuration data. For example, EEPROM memory may be used to store hard disk 113 geometry and configuration data. BIOS routines 123 are included in ROM 122 and provide basic computer initialization, systems testing, and input/output (I/O) services. For example, BIOS routines 123 may be executed by the processor 101 to process interrupts that occur when the bridge 111 attempts to transfer data from the ISA bus 120 to the host bus 102 via the bridge 111, peripheral bus 110, and system controller 103.

To exchange information at a common interface, the components of the system 100 must conform to a common protocol defined for data exchange at the particular interface. For example, peripheral devices 111, 112, and 114 may exchange information with each other and with the system controller 103 at a peripheral bus interface 110. To do so, each of the devices 111, 112, 114 and 103 exchange data over the bus interface 110 using a common protocol conform. The common protocol at the bus interface 110 may be, for example, the PCI 2.1 protocol as specified in the *PCI Local Bus Specification Revision* 2.1. System components may implement different protocols at different interfaces. For example, the bridge controller may implement the PCI 2.1 protocol at the interface to the PCI bus 110 and may implement the ISA protocol at its interface to the secondary bus 120. Multiple protocols can operate at a common physical interface if they are designed to do so compatibly. For example, device 112 may implement the PCI 1.0 protocol at its bus interface 110 while the network adapter 114 may implement the PCI 2.1 protocol at its interface to the bus 110. Since PCI 1.0 and PCI 2.1 are designed to coexist at a common bus, various combinations of peripheral devices employing either PCI 1.0 or PCI 2.1 may be combined on a PCI bus.

Figure 2:
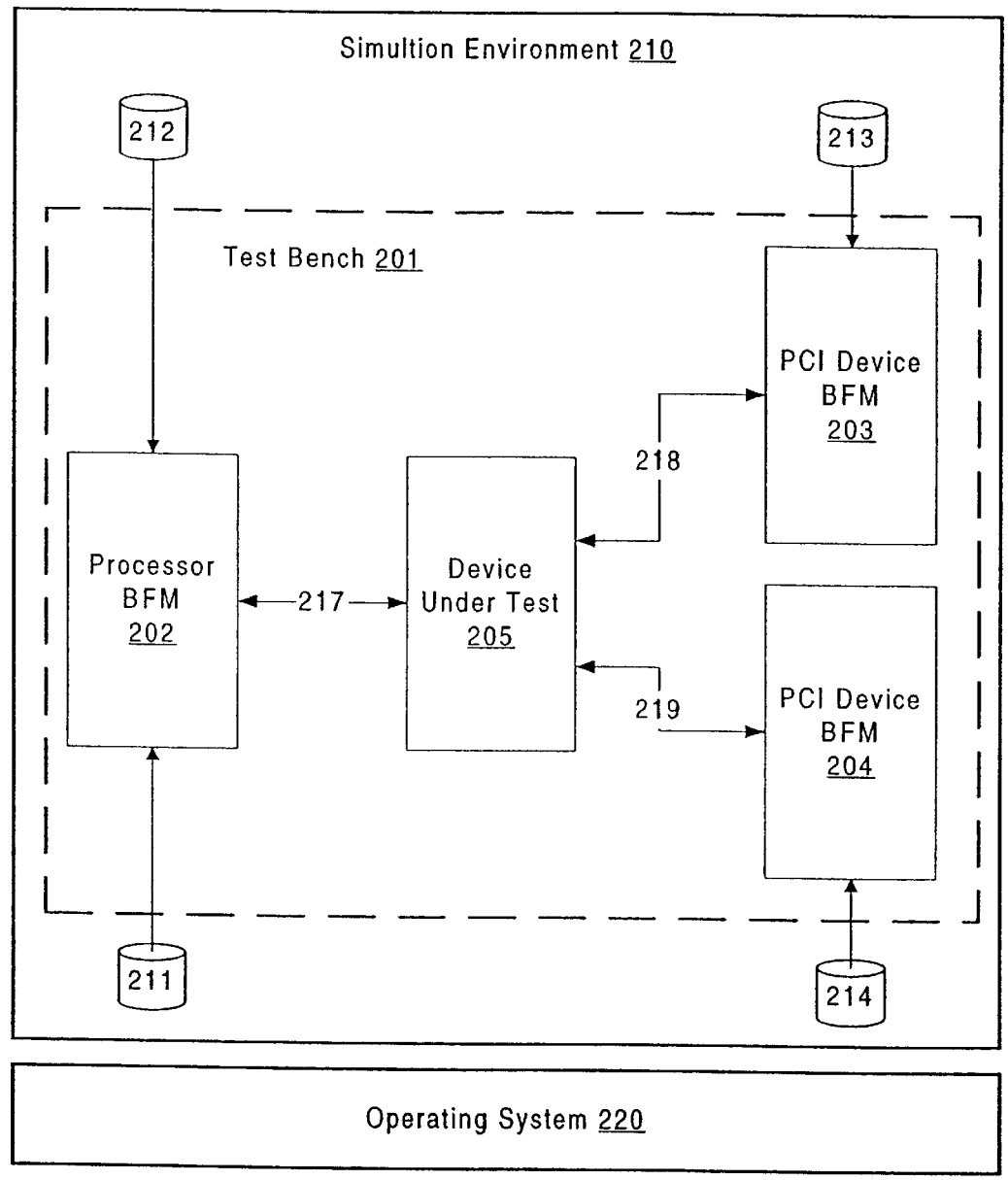
FIG. 2 is an exemplary simulation environment.

To ensure that the components of a computer system conform to desired design constraints and system protocols, the components are subject to testing and validation procedures during their design and are further tested and validated as a part of a fully designed system 100. Referring to FIG. 2, testing and validation of computer system component design and of complete computer system designs can be performed using a software implemented simulation environment 210. The simulation environment 210 may be provided by an off-the-shelf product such as the ModelSim simulator by Model Technology, Inc. or the Verilog XL simulator by Cadence Design Systems, Inc.

In a simulation environment 210, computer system components can be modeled using one or more bus functional models (BFMs) and a device under test (DUT).The BFMs and DUT operate to simulate data exchanges between components of an operating computer system. Typically, each BFM models the behavior of a computer system component or group of components whose operation is known, well defined, or otherwise considered reliable and the DUT simulates a computer system component whose operation needs to be tested to ensure that it can operate reliably. For example, in the simulation environment 210, a processor BFM 202 may simulate a host processor 101 (FIG. 1), the device under test (DUT) 203 may simulate a new or experimental host bus to PCI bus system controller 103 (FIG. 1), and PCI device BFMs 204 and 205 can simulate PCI peripherals such as a the video controller 112 and network adapter 114 (FIG. 1). A simulated exchange of signals between the BFMs 212–204 and the DUT 205 can help to ensure that the DUT operates reliably.

The BFMs and the DUT are software programs that are typically written in a hardware description language such as Verilog HDL or in the very high speed integrated circuit description language (VHDL). Verilog HDL is a hardware description language used to design and document electronic systems. Verilog HDL allows designers to design at various levels of abstraction. VHDL is another hardware description language. VHDL was developed by the Institute of Electrical and Electronics Engineers (IEEE). The simulation environment 210 includes the necessary hardware description language interpreter or BFM/DUT program compiler required to execute the BFM or DUT. The hardware description language implementing the BFM or DUT may be developed by a programmer using hardware description language programming tools or can be derived from the hardware description language that is used in designing the physical component being modeled.

In a typical simulation environment, BFMs receive a bus functional model language (BFML) program that controls the generation of bus signals sent between the BFM and the DUT. The DUT, which is typically a hardware description language program generated by a computer aided design system, responds to the bus signals. The simulation environment 210 includes facilities to automatically monitor these signal exchanges and ensure that they conform to applicable system and bus protocol constraints.

BFML code executed or interpreted by a controlling BFM can be used to test the behavior of a device under test. This allows BFML processing and interface signal generation by a well-understood controlling BFM element to be used for testing the behavior of an experimental device. For example, in the simulation environment 210, the processor BFM 202 may be the controlling BFM used to test an experimental device under test 203. In such an environment, BFML code 212 processed by the controlling BFM can be used to produce signals at interface 217. The device under test 203 will respond autonomously (i.e., without the use of programmed BFML code), but must adhere to the bus protocol on all interfaces 217, 218, and 219. The bus protocol as well as the data patterns returned by the DUT are verified by each Bus Functional Model. By analyzing responses to the read and write commands generated by the processor BFM 202, the design of the controller BFM 203 can be tested and validated. Bus protocol and read data patterns are implicitly checked by the BFM using capabilities provided by the simulation environment. If there is a discrepancy, an error message is generated.

Referring to FIG. 3, a conventional BFML program is shown. A BFML program is typically written using programming code statements that instruct the BFM to read from or write data to a specified address on a simulated bus. For example, a write statement is shown at line 19 and a read statement is shown at line 35 of FIG. 3. Additionally, the BFML program can specify BFM control information. For example, in BFMs supporting burst data transfers or data cache functions, the BFML program may specify whether read or write transactions are "burst" transactions or whether cache functions are enabled or disabled. Other control instructions may also be specified depending on the capabilities of the BFM being programmed. Conventional BFML programs can also include program execution controls such as loops, conditional branches, and may include mathematical calculations. For example, looping statements are seen at lines 18, 23, 34, and 39 of FIG. 3 and mathematical calculations are seen at lines 20–22 and 36–38. The use of such control and calculation statements can impact simulation speed by requiring additional processing in the simulation environment. Additionally, when a BFML program includes loops or conditional branches, it may be difficult for a human simulation environment operator to determine the state of particular BFMs when a simulation error is detected. Moreover, generating BFML programs for a collection of BFMs using conventional programming techniques, such as by writing a BFML program using a text editor, can be extremely time consuming.

Figure 4:
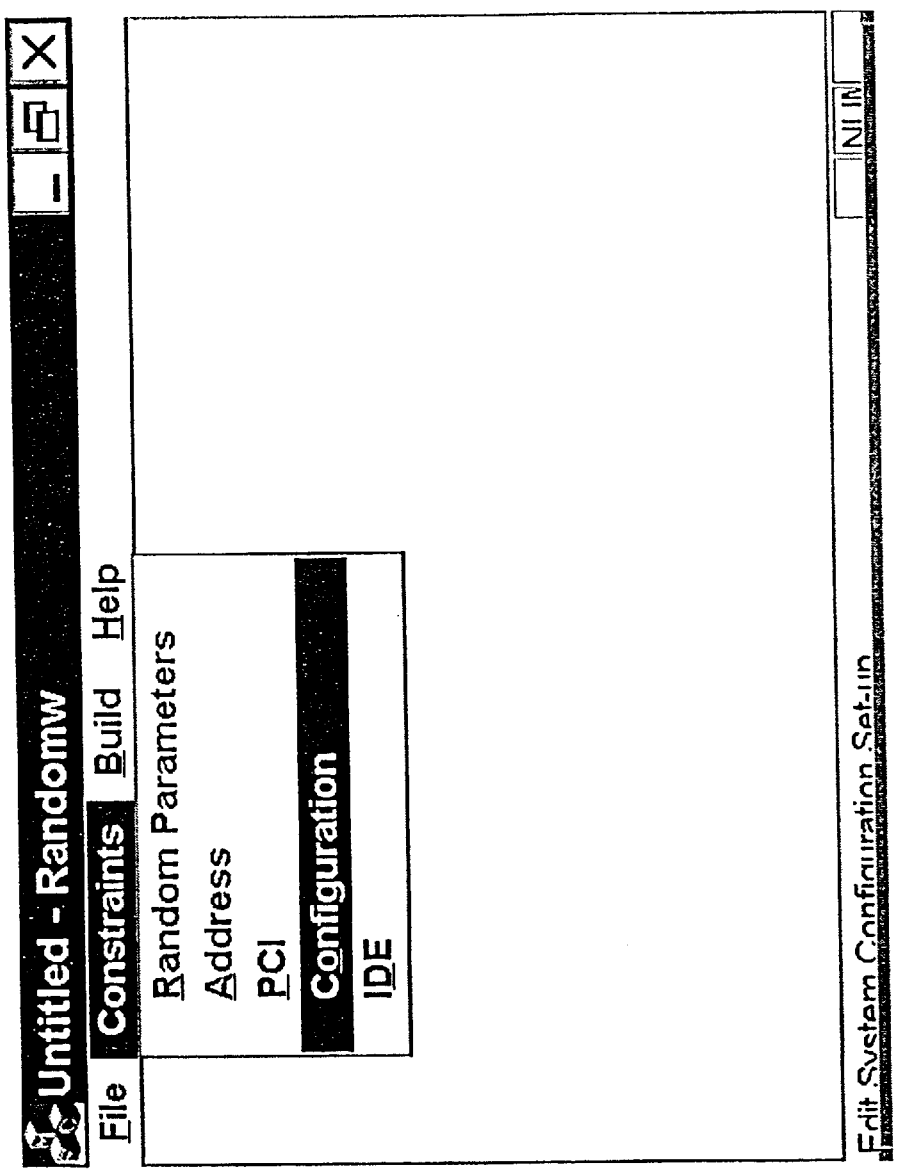

Improvements in the generation of BFML code can be obtained using a BFML program generator. FIGS. 4–11 illustrate input screens provided by an exemplary BFML program generator. According to the invention, a BFML program generator receives input constraints and generates one or more BFML programs conforming to the received constraints. An exemplary BFML program generated by the BFML program generator can be seen in Table 1. Referring to FIG. 4, a BFML program accepts various categories of constraints that define properties of the BFML code to be generated. For example, "Random Parameters," "Address," "PCI," "Configuration," and "IDE" constraints. An operator of the BFML generation program may select various constraint categories and will be asked for particular constraint values as explained below.

One BFM function is to generate read and write transactions that are addressed within particular bus address ranges. Referring to FIG. 5, the BFML generator receives a set of address range constraints that determine the read and write transactions included in generated BFML program code. For example, in the exemplary BFML generator, ten different address ranges may be specified. For each specified address range a minimum and a maximum address value can be specified as well as a probability value. The designated probability values determines the likelihood that an address within a particular range will be selected by the BFML program generator for a particular bus transaction. Additionally, a user can specify whether data within each specified address range is "cacheable." If an address range is indicated as "Cacheable," a BFM having a simulated cache memory will cache data transactions within the designated address range. The ability to mark data as "cacheable" may affect the generation of particular bus signals such as cache "snoop" signals. Such "snoop" signals are generated by BFMs to ensure consistent data states between various simulated devices. Furthermore, a user can specify whether particular address ranges pertains to, for example, bus addresses assigned to an IDE (integrated device electronics) hard disk drive controller, or a PCI Local Bus device, or a particular type of memory component.

Figure 6:
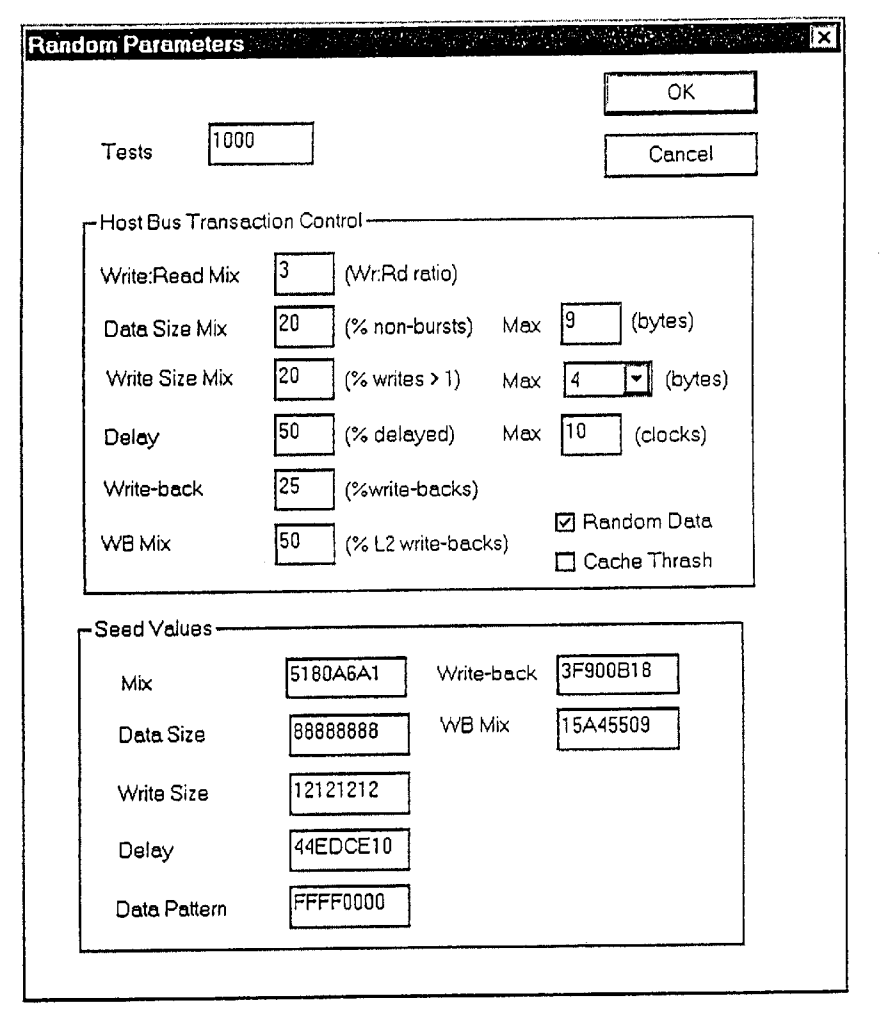

Read or write transactions within the designated address ranges are further influenced by specified random parameter constraints. Random parameter constraints determine the mix of read and write transactions that may occur over a BFMs simulated bus interface. Referring to FIG. 6, exemplary random parameter constraints include a ratio of write to read transactions, data transfer size constraints, delay constraints, and cache operation constraints. Additionally, in some implementations, particular "seed values" may be provided to control the random generation of data used in the bus transactions.

Figure 8:
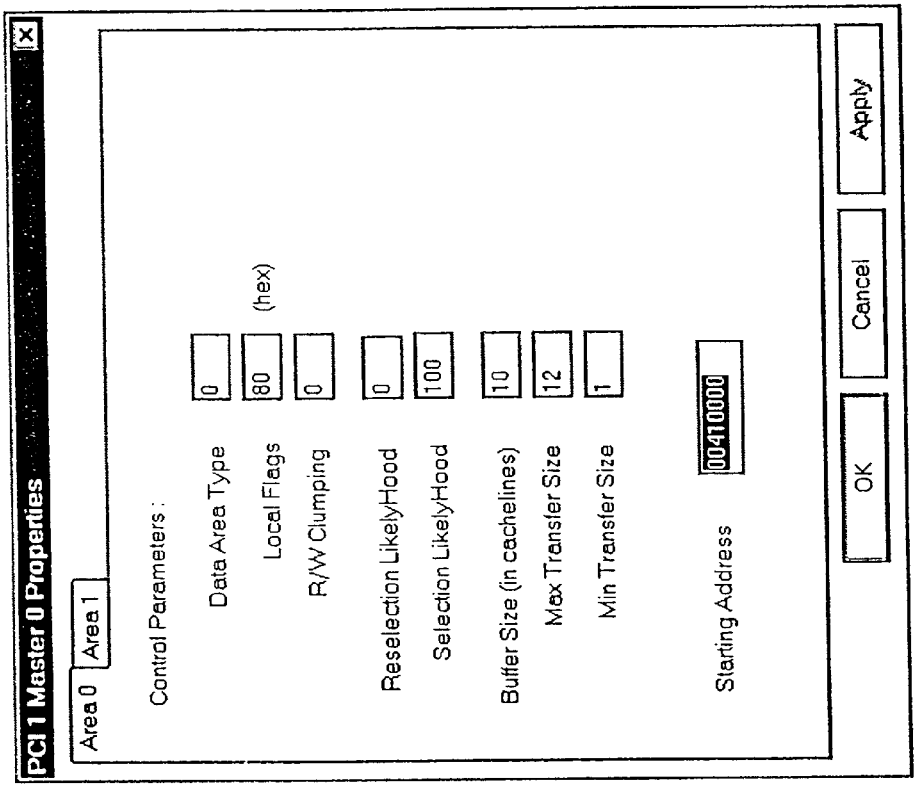
Figure 9:
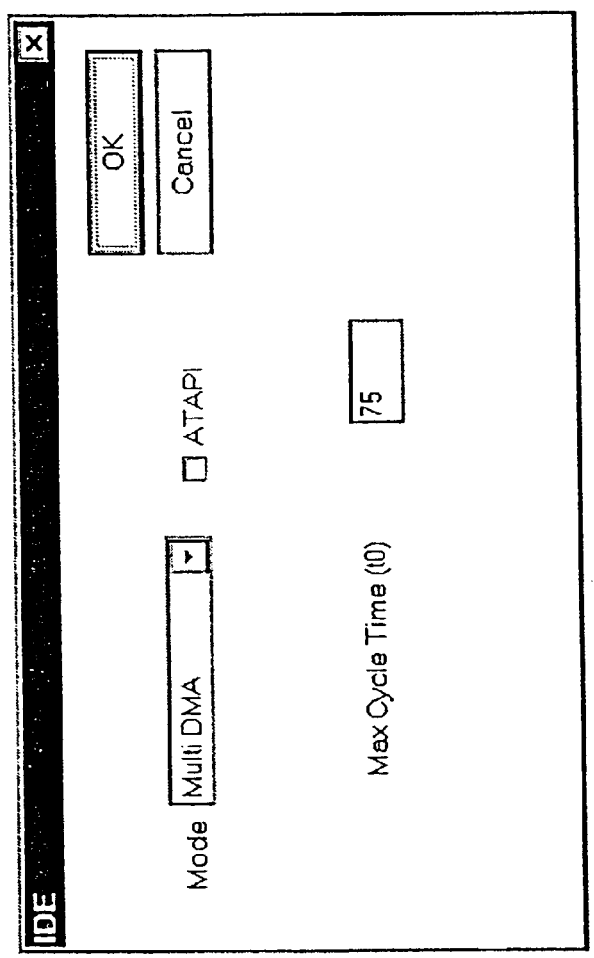
Figure 10:
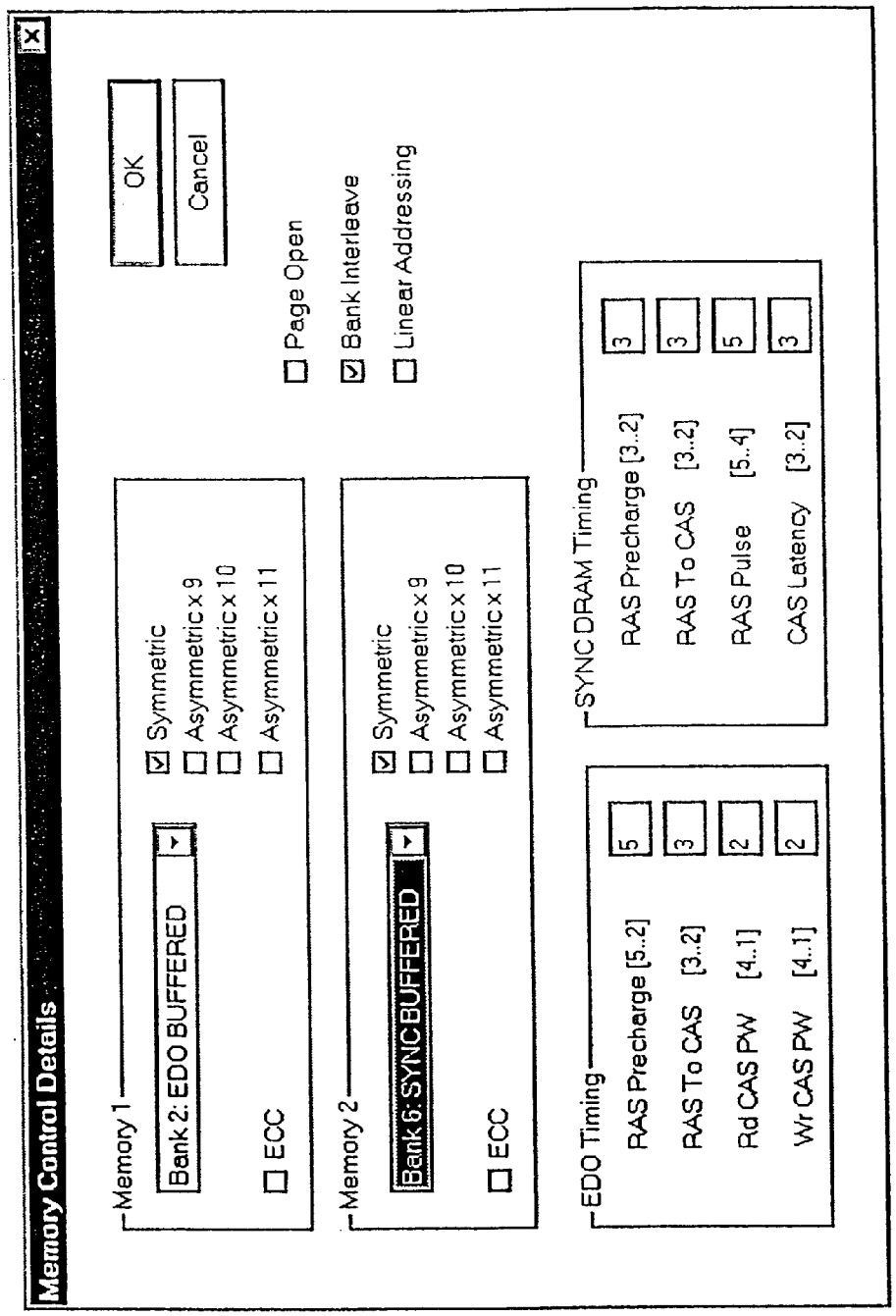
Figure 11:
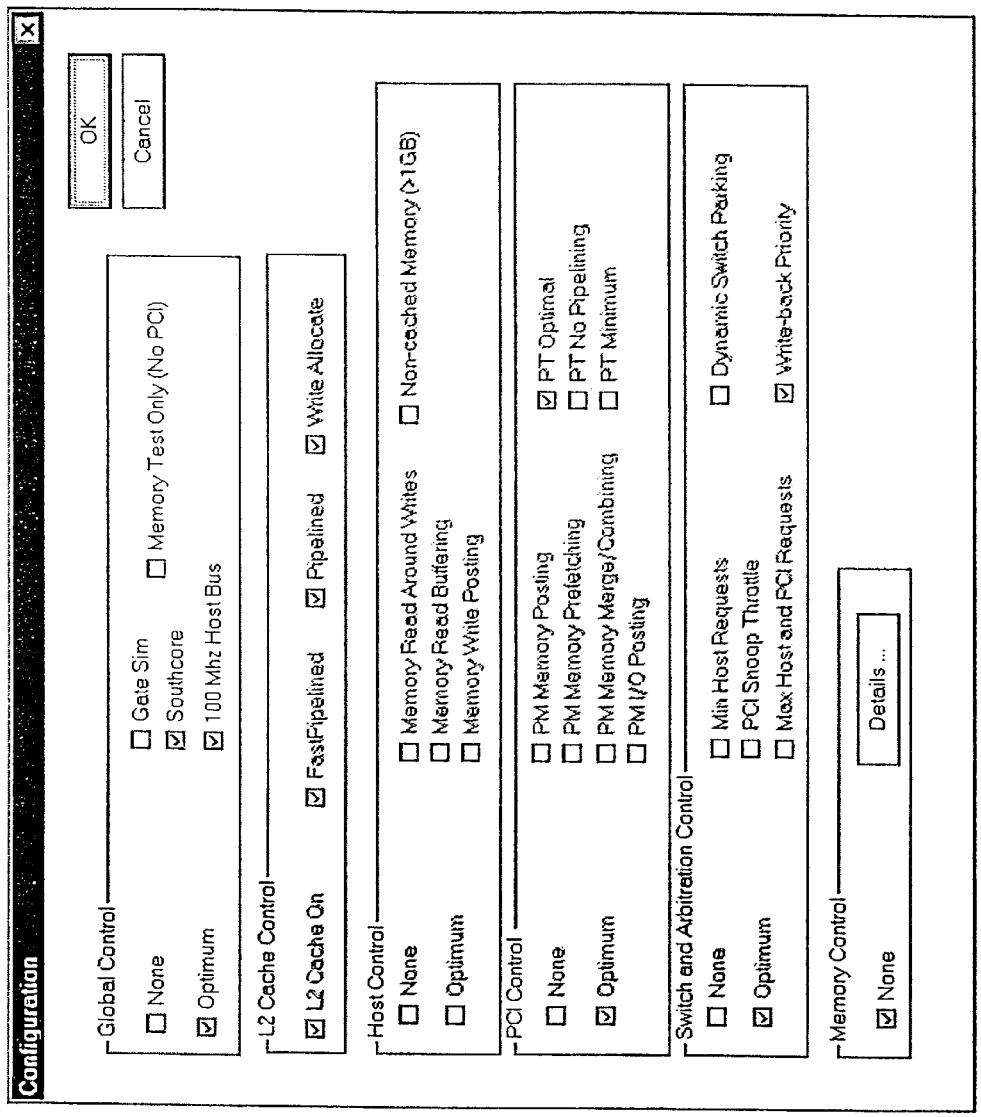

Implementations may also include constraints tailored to a particular type of BFM or particular functionality within a BFM. For example, PCI bus device, IDE device, and memory device constraints may be selected by a user. Referring to FIGS. 7 and 8, constraints tailored to a PCI bus devices can include the PCI device's utilization of the PCI local bus, whether the PCI bus device supports 64-bit operations, and various other PCI device constraints. Referring to FIG. 9, constraints tailored to an IDE device can include the data transfer mode supported (such as the IDE "Multi Word DMA" mode), whether the IDE device conforms to the attachment packet interface (ATAPI) standard, and the maximum bus cycle time. Referring to FIG. 10, constraints tailored to a memory device include the type of memory supported (for example, extended data out dynamic RAM (EDO DRAM) or synchronous dynamic ram (SDRAM)), and particular memory bus timing constraints. Other timing constraints may include, for example, the minimum inter-arrival time between data transfer transactions. For example, a BFML program generator can receive a timing constraint indicating that each write transactions for a particular BFM device requires two clock cycles to perform the write and requires a one clock cycle wait period before another cycle can begin. Referring to FIG. 11, still other constraints may be specified to control the overall generation of BFML code.

A BFM may provide device initialization instructions to a device under test. For example, referring to FIGS. 1 and 2, the computer system 100 may require the CPU 101 to initialize the system controller 103 whenever the system 100 is reset. A BFM 202 modeling the processor 101 would, likewise, be required to initialize a DUT 203 modeling the system controller 103. If the BFM 202 is to initialize the DUT 203, the BFML 212 executed by BFM 202 must include appropriate DUT 203 initialization commands. Such commands may be provided as an "alternate data stream" file to a BFML generator program for inclusion in a generated BFML file 212. For some alternative data streams, it is necessary to synchronize data transfers by the BFM with responses from the DUT. In such cases, synchronization "wait" commands may be included in the generated BFML program.

Figure 12:
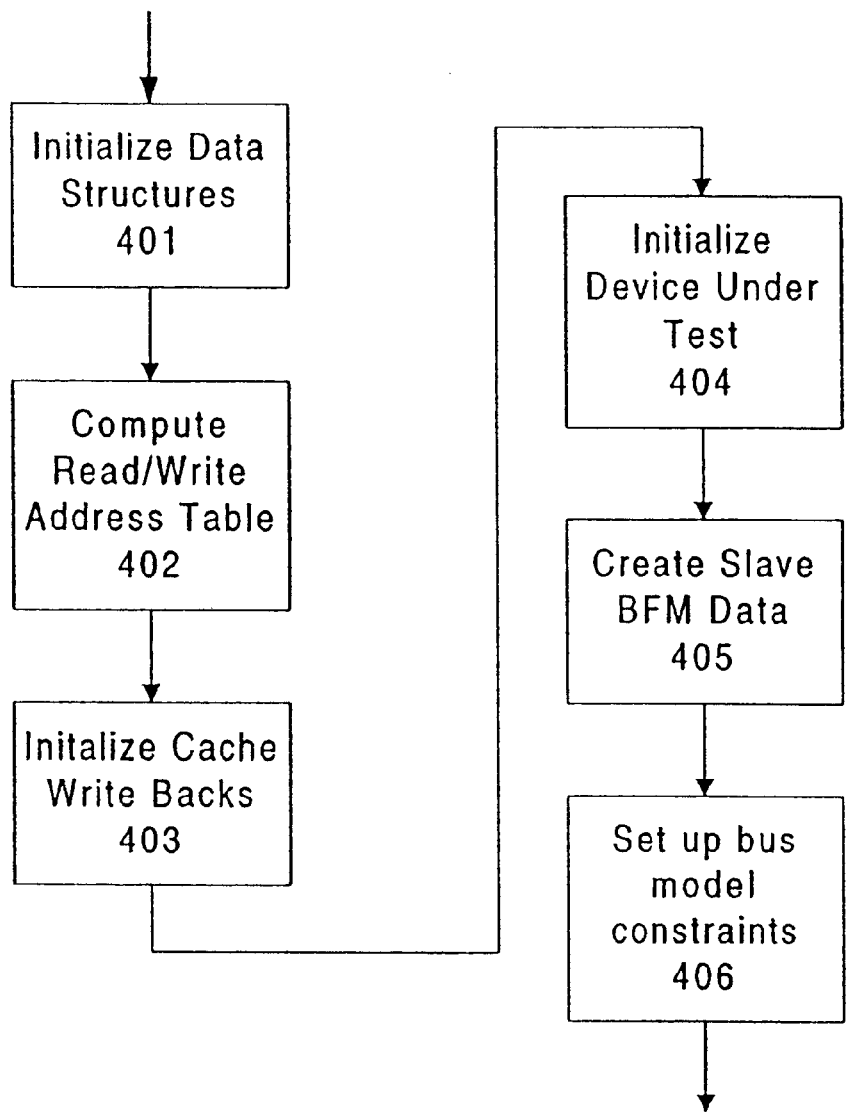
FIGS. 12–13 flowchart an exemplary BFML generation process.
Figure 13:
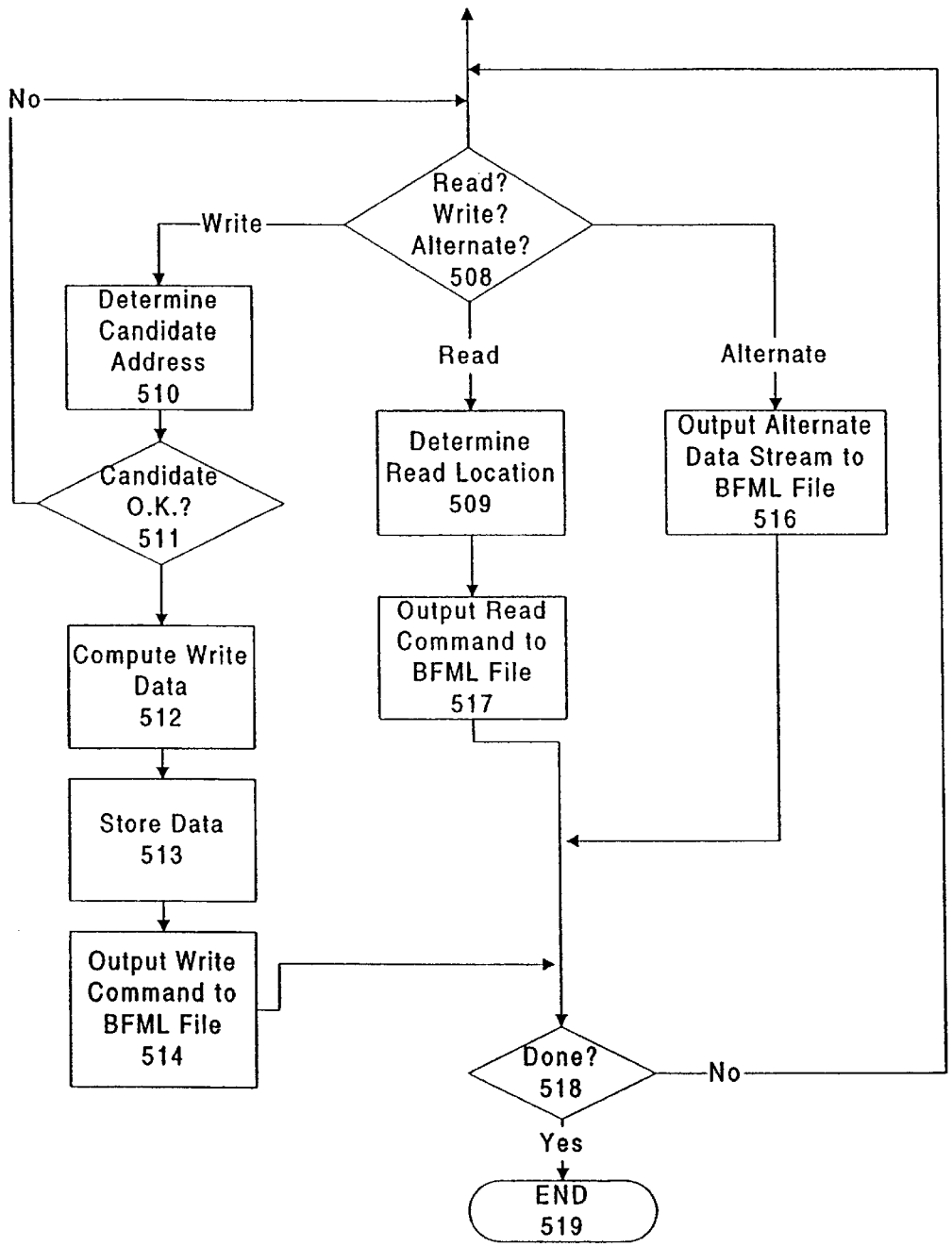

Referring to FIGS. 12–13, generation of BFML code by the BFML program generator begins with the gathering of data at the generator interface screens (FIGS. 4–11). The gathered data is used to initialize internal code generator data structures that control code execution (step 401). The code generator may use a collection of table including an address range table. The address range table includes user defined address constraints (such as those received at the input screens of FIGS. 5 and 6). Fields in the address range table may include minimum and maximum boundaries for address ranges, type fields indicating the type of address (for example, PCI, cacheable address, I/O or memory address, and whether the address may be locked) and the probability that the specified range will be used relative to all other address ranges entered.

The program code generator may also store a history or transaction trace table. The history table can be used to store random data patterns, addresses, data transfer sizes, and memory type information pertaining to generated BFML write instructions. The history table can store the address and data value for each of the generated write instruction. The history table thereby captures the expected state of a BFM executing the generated BFML and of DUTs responding to the BFM. History information can be subsequently used to generate BFML read instructions. To generate a read instruction, the BFML program code generator selects an address previously written to and selects the most recent data value written to that address. The selected address and data value are designated in the generated read instruction. When the read instruction is executed by a BFM, simulation environment functions can compare the read value with the expected value. If a mismatch occurs, a DUT operation error is reported to the user.

The alternate data stream trace table may have a structure similar to that of the history table and may include a pre-computed data stream with one read, write, or control command per record. When an alternate data stream address range is chosen from the address range table (step 508, FIG. 5), one command from the alternate data stream table is output to the BFML file.

A BFM may include simulated cache functionality. For example, a BFM simulating a Pentium® microprocessor may include a simulated L1 cache. For such BFMs, the generated BFML initialization routine may pre-load selected cache locations by storing a set of random address and data values in the cache. This allows testing of cache line snoop functionality by allowing, for example, cache to memory write-back operations in response to a snoop signal at a bus interface (step 403).

BFM operations triggered by a snoop signal can include internal snoop write backs and external snoop write backs. From the perspective of a device under test, an internal snoop write back at a BFM is equivalent to a write executed by the BFM. The BFML program generator can simulate internal snoop write back operations as using "typical" BFML write command. External snoop write backs, on the other hand, are snoops that are initiated by the system controller on the CPU bus. An external snoop write back is executed, for example, when a PCI bus master request access to main memory. If the contents of the main memory being accessed by the bus master is also stored in, for example, a simulated microprocessor L1-cache, an external snoop write back is generated. The BFML program generator's role in this type of write back is to periodically monitor the contents of simulated main memory through the use of inserted read statements. Additionally, the BFML program generator may include statements to mark selected memory locations in the cache as being modified, thus forcing cache write-back operations to occur upon a "snoop." Implementations may choose to implement the L1 cache as a separately modeled BFM that monitors main memory data as it is passed to the processor via the host bus. This cache model BFM maintains an image of the L1 cache, making it available to the processor BFM at any time. When an external snoop is initiated by the system controller, the BFML execution flow at the processor BFM is interrupted, similar to an external interrupt. The processor BFM receives the L1 cache data image formatted by the cache BFM model, and executes a write-back (burst enabled) write cycle. When the cycle is complete, the processor BFML continues from the point at which it was interrupted. Initialization values may also be provided to the device under test (step 404).

The BFML program generator can generate data needed by a second BFM (step 405) by, for example, creating a separate "slave BFM data" file with commands in a BFML syntax recognized by the second BFM. This may be used where multiple BFMs are included in a simulation. In a multiple BFM simulation, the behavior of each BFM must be coordinated to properly and thoroughly test the device under test. The slave data file may include random transactions similar to those described earlier, or may include transactions that respond to signals generated by other BFMs (i.e., the processor BFM). The main and the separate file may be synchronized on a bus transaction-by-bus transaction basis. For instance, a write by the processor BFM 202 to the PCI device BFM 203 would include a BFML write command in BFML program file 212 synchronized with a corresponding response command in BFML program file 205. Synchronization between BFML produced for the various BFMs can be provided by the BFML generator.

After initialization of the BFML program generator (steps 401–406), BFML code generation proceeds as shown in FIG. 5. Referring to FIG. 5, code generation includes multiple code generation steps whereby a random BFML write statement, a BFML read statement, or an alternate data stream BFML statements is appended to a BFML output file. In doing so, a determination is made as to whether a write statement, a read statement, or an alternate data stream statement generation is to be performed (step 508). This determination may be a random determination within the limits of the user defined constraints.

If write statement generation is selected (at step 508), a candidate write address is determined (step 510). The candidate address is determined based on constraints specified in the address ranges table. After selecting a candidate address, the BFML program generator determines if the selected candidate address is to be accepted or rejected. The candidate address may be rejected if, for example, the history table indicates that data previously written to the address has not been verified (that is, data was previously written to the address but has not yet been read back from that address). If the candidate address is rejected, the code generation algorithm may return to statement type determination (step 508). Alternatively, a new candidate address may be selected (step 510). Once a candidate address is accepted, the BFML program generator determines the block size and data values to be included in a produced BFML write statement (step 512). This determination may be limited by user constraints such as the data transfer size or may be randomly determined. The determined data values and address information are stored in the history table by the BFML program generator for use in the future production of BFML read statements (step 513). If the address being written to is a cache location, the BFML generator will update its internal view of the cache status. A BFML write statement is then added to the BFML file (step 514).

If a read operation is to be performed, a read address and data value are selected (step 409) from among those previously addressed by a write statement (such information may be obtained from the history table). The selected address or address range is chosen from history table data listing addresses accessed during previous write operations (step 513). Read addresses, read block size, and read data values may be selected on a "first-in, first-out" basis to correspond to previously generated write statements. The read operation is then placed as a BFML command in the generated BFML file.

The code generator 300 may also intermix an alternate data stream with produced read and write instructions. An alternate data stream is a predetermined series of BFML instructions used to control and test a second bus functional model and associated controller device. To include alternate data streams, the BFML program generator reads alternative data stream BFML statements from a separate alternate data stream file and appends the read statement to the BFML file being generated (step 416). For example, alternate data stream statements providing for the transfer of one or more blocks of data to and from a simulated IDE hard disk device may be included as part of a generated BFML program in order to test an IDE bus controller device.

After a write, read, or alternate data stream command has been output to the BFML file, a determination is made as to whether additional statements are to be added (step 418). If so, code production continues at step 508. Once user constraints and a specified test size have been satisfied, BFML program generation is complete. By way of example, the BFML program generator may produce program code such as that shown in Table 1.

The techniques and mechanisms described here were implemented on a computer executing the Microsoft Windows NT® operating system using the Microsoft Visual C++® programming language. However, they are not limited to any particular hardware or software configuration, but rather they may find applicability in any computing environment in which automated computer simulated hardware verification is desired. These techniques and mechanisms may be implemented in hardware or software, or a combination of the two. Preferably, implementation is achieved with computer programs executing on programmable computers that each include a processor, a storage medium readable by the processor (including volatile and non-volatile memory and/or storage elements), and suitable input and output devices. Program code is applied to data entered using the input device to perform the functions described and to generate output information. The output information is applied to one or more output devices.

Each such computer program is preferably stored on a storage medium or device (e.g., CD-ROM, hard disk or magnetic diskette) that is readable by a general or special purpose programmable computer for configuring and operating the computer when the storage medium or device is read by the computer to perform the procedures described in this document. The system also may be implemented as a computer-readable storage medium, configured with a computer program, where the storage medium so configured causes a computer to operate in a specific and predefined manner.

The invention may be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed ASICs (application-specific integrated circuits).

Still other embodiments are within the scope of the following claims.

TABLE 1

```
-----MAR 20 1998---15:18:37------------------------
Constraints-----------------------------------------
WriteMax=40
RandomDataEnable=ON    CacheThrash=OFF
--Global     : None=OFF    Optimum=OFF    MemoryTestOnly=OFF    GateSim=OFF
L2           : L2Cache=ON    WrAlloc=ON    Pipeline=ON    FastPipeline=ON
Host         : None=ON    Optimum=OFF
               Non Cached=OFF
PCI          : None=ON    Optimum=OFF
               PT Optimum=ON    PT No Pipelining=OFF    PT Minimum=OFF
               I/O Posting=ON
SW&Arb       : None=ON    Optimum=OFF
               Max Host&PCI=OFF    Min Host=OFF    PCI Snoop Throttle=ON
               WB Priority=ON    Dyn SW Parking=OFF
IDE          : ATAPI=OFF    Drive Mode=0    Maximum Cycle Time(t0)=75
               Max    Weight    Seed Mix:              0       3     44EFAF2C
Request_Dly:     10      50     8B0911E5
Data_Size:        9      20     74C7EBD6
Data:             0       0     A5C8E453
WB:              10      25     EC7B9B5C
WBMix:           10      50     0023CC32
         Max         Min        Probability    PCI    IO    Cacheable    IDE    Lockable 0)    001FF5FF    001FE500         25          OFF    OFF      ON        OFF      OFF
1)    40FFFFFF    40000000         25          ON     OFF      OFF       OFF      OFF
2)    42FFFFFF    42100000          0          ON     OFF      OFF       OFF      OFF
3)    000002EF    00000200         25          ON     ON       OFF       OFF      OFF
4)    00000BFF    00000800          0          ON     ON       OFF       OFF      OFF
5)    00000FFF    00000C00          0          ON     ON       OFF       OFF      OFF
6)    4FFFFFFF    40000000          0          OFF    OFF      OFF       OFF      OFF
7)    001FFFFF    001FF600         25          OFF    ON       OFF       ON       OFF
8)    00000000    00000000          0          OFF    OFF      OFF       OFF      OFF
9)    00000000    00000000          0          OFF    OFF      OFF       OFF      OFF
variable   ConfigData,   WritebackData;
Poll the IDE for specified drive status
procedure PollForDriveStatus (Mask,Value,DriveStatusReg)
variable Busy,DataMask,Adrs;
begin
    Busy:=0;
    while (Busy==0) loop
        idle(10)
        read (IO , addr => DriveStatusReg , byte_cnt => 1, align_data);
        idle(1);
        Adrs: = DriveStatusReg AND x"07";
        if(Adrs == x"07") then
            DataMask[0] := databus[7] AND Mask[0];
        end if;
        if( Adrs ==x"02") then
            DataMask[0]:=databus[2]AND Mask[0];
        end if;
        printf("Polled Data = ", DataMask, hex);
        if( DataMask == Value ) then
            Busy := 1;
        end if;
    end loop;
end;      --PollForDriveStatus
***********************************************************************
                BEGIN MAIN BFML PROGRAM                *
***********************************************************************
main
begin
control_flags (cache_enb, write_thru_enb, intr_enb);
print (none, no_dp_check, no_ap_check);
*******************************************************
         WRITE TO DEVICE UNDER TEST             *
         PCI CONFIGURATION REGISTERS            *
*******************************************************
write (IO, addr => x"00000CF8",data_value =>x"00000000800000E0",byte_cnt => 4);
write (IO, addr => x"00000CFC",data_value =>x"0000000000000600",byte_cnt => 2, align_data);
write (IO, addr => x"00000CF8",data_value =>x"000000008000000C",byte_cnt => 4);
write (IO, addr => x"00000CFC",data_value =>x"000000000000FF00",byte_cnt => 2, align_data);
write (IO, addr => x"00000CF8",data_value =>x"000000008000005C",byte_cnt => 4);
write (IO, addr => x"00000CFC",data_value =>x"000000003333CCCC",byte_cnt => 4, align_data);
write (IO, addr => x"00000CF8",data_value =>x"000000008000081C",byte_cnt => 4);
 -
 -
 -
```

TABLE 1-continued

```
write (IO, addr => x"00000CF8",data_value =>x"0000000080001054",byte_cnt => 4);
write (IO, addr => x"00000CFC",data_value =>x"0000000000000822",byte_cnt => 2, align_data);
**********************************************************
        INITIALIZE MEMORY FOR PCI MODELS           *
**********************************************************
Initialize RAM used by PCI 1 Master 0
write (addr => x"00410000", byte_cnt =>8, data_value => x"0000000000000000");
write (addr => x"00410008", byte_cnt =>8, data_value => x"0000000000000000");
write (addr => x"00410010", byte_cnt =>8, data_value => x"0000000000000000");
write (addr => x"00410018", byte_cnt =>8, data_value => x"0000000000000000");
**********************************************************
            INITIALIZE PCI MODELS                  *
**********************************************************
Initialize PCI Memory Table used by PCI 1 Master 0
write (addr => x"40000000", byte_cnt =>8, data_value => x"970192818D008E7F");
write (addr => x"40000008", byte_cnt =>8, data_value => x"00013219_00000000");
write (addr => x"40000010", byte_cnt =>8, data_value => x"0080000064010C01");
write (addr => x"40000018", byte_cnt =>8, data_value => x"00000000_00410000");
Initialize PCI Memory Table used by PCI 1 Master 1
write (addr => x"40000100", byte_cnt =>8, data_value => x"93016AFC7100D9AB");
write (addr => x"40000008", byte_cnt =>8, data_value => x"00003219_00000000");
printf ("END    : Writing Memory Table");
printf ("--- idling 200 clocks to give time for writes to take place ---");
idle (100);
idle (100);
printf ("---------- Wakingup PCI Masters now ----------");
wakeup (2);   -- PCI 1 Master 0
wakeup (3);   -- PCI 1 Master 1
sleep (0);    -- wait for wakeup from PCI models
printf ("--- idling 100 clocks to give time for PCI Masters to read from Slave Memory ---");
idle (100);
**********************************************************
       INITIALIZE DEVICE UNDER TEST                *
              FUNCTIONAL REGISTERS                 *
**********************************************************
write (IO, addr =>x"20", data_value =>x"10", byte_cnt =>1, align data);
write (IO, addr =>x"21", data_value =>x"00", byte_cnt =>1, align data);
-
-
-
write (IO, addr =>x "A1"data_value =>x"00", byte_cnt => 1 , align data);
write (IO, addr =>x "A1"data_value =>x"BF", byte_cnt => 1 , align data);
write (IO, addr =>x "21"data_value =>x"FB", byte_cnt => 1 , align data);
**********************************************************
         START RANDOM EXERCISE                     *
                                                   *
**********************************************************
```

| Code | Annotation |
|---|---|
| write (IO, addr => x"00000296",data_value => x"24E4000000000000",byte_cnt => 1, next_request => 10); | Adrs Range #4 |
| write (IO, addr => x"00000297",data_value => x"24E4000000000000",byte_cnt => 1, next_request => 3); | Adrs Range #4 |
| - | |
| - | |
| write ( MEM, addr => x"4005FACF",data_value => x"C028000000000000",byte_cnt => 1, next_request => 0); | Adrs Range #2 |
| write ( MEM, addr => x"4005FAD0",data_value => x"00000000000000C8",byte_cnt => 1, next_request => 9); | Adrs Range #2 |
| control_flags (cache_dsb, write_thru_enb); | |
| read (IO, addr => x"00000296",data_value => x"24E4000000000000",byte_cnt => 2, next_request => 0); | Adrs Range #4 |
| control_flags (cache_enb, write_thru_enb); | |
| control_flags (cache_dsb, write_thru_enb); | |
| read ( MEM, addr => x"4005FACE",data_value => x"C028000000000000",byte_cnt => 2, next_request => 0); | Adrs Range #2 |
| read ( MEM, addr => x"4005FAC0",data_value => x"00000000000000C8",byte_cnt => 1, next_request => 0); | Adrs Range #2 |
| control_flags (cache_enb, write_thru_enb); | |
| write ( MEM, addr => x"001FE600",data_value => x"C81DFECB47F4AA46", byte_cnt => 8, next_request => 9); | Adrs Range #1 |
| write ( MEM, addr => x"001FE608",data_value => x"E86A05E65826035D", byte_cnt => 8, next_request => 0); | Adrs Range #1 |
| write ( MEM, addr => x"001FE610",data_value => x"49C2127D38BE0E2B", byte_cnt => 8, next_request => 0); | Adrs Range #1 |
| write ( MEM, addr => x"001FE618",data_value => x"6ECA5B8BDA463686", byte_cnt => 8, next_request => 0); | Adrs Range #1 |
| read ( MEM, addr => x"001FE600",data_value => x"6ECA5B8BDA463686_49C2127D38BE0E2B_E86A05E65826035D_C81DFECB47F4AA46", byte_cnt => 8, next_request => 3); | Adrs Range #1 |
| L1 Write-back | |
| read (addr => x"00410000", byte_cnt =>8); | Special Cycle: Write-back |
| write (IO, addr => x"00000CF8",data_value => x"0000000080001040", byte_cnt => 4); | Alt. Data Stream: IDE |
| write (IO, addr => x"00000CFC",data_value => x"0000000004140018", byte_cnt => 4 , align_data); | Alt. Data Stream: IDE |
| write (IO, addr => x"00000248",data_value => x"000000000000B2BF", byte_cnt => 2, next_request => 0); | Adrs Range #4 |
| control_flags (cache_dsb, write_thru_enb); | |
| control_flags (cache_esn, write_thru_enb); | |
| write ( MEM, addr => x"001FF228",data_value => x"615B167120C90DD0", byte_cnt => 8,next_request => 0); | Adrs Range #1 |
| write ( MEM, addr => x"001FF230",data_value => x"E4374FB4A3ED3A93", byte_cnt => 8,next_request => 2); | Adrs Range #1 |
| - | |

TABLE 1-continued

| | |
|---|---|
| write (IO, addr => x"0000023D",data_value => x"00007B1D9C000000", byte_cnt => 1, next_request => 6); | Adrs Range #4 |
| write (IO, addr => x"0000023D",data_value => x"00007B1D9C000000", byte_cnt => 1, next_request => 0); | Adrs Range #4 |
| L1 Write-back | |
| read (addr => x"00410000",byte_cnt => 8); | |
| control_flags (cache_dsb, write_thru_enb); | |
| read (IO, addr => x"00000248",data_value => x"000000000000B2BF",byte_cnt => 1, next_request => 4); | Adrs Range #4 |
| read (IO, addr => x"00000249",data_value => x"000000000000B2BF",byte_cnt => 1, next_request => 0); | Adrs Range #4 |
| control_flags (cache_enb, write_thru_enb); | |
| write (MEM, addr => x"40363280",data_value => x"0000000000000000", byte_cnt => 8, next_request => 0); | Adrs Range #2 |
| write (MEM, addr => x"40363288",data_value => x"0000000000000000", byte_cnt => 8, next_request => 9); | Adrs Range #2 |
| write (MEM, addr => x"40363290",data_value => x"0000000000000000", byte_cnt => 8, next_request => 0); | Adrs Range #2 |
| - | |
| - | |
| - | |
| write (MEM, addr => x"40331A1E",data_value => x"D31A366CB1000000", byte_cnt => 1, next_request => 4); | Adrs Range #2 |
| write (MEM, addr => x"40331A1F",data_value => x"D31A366CB1000000", byte_cnt => 1, next_request => 4); | Adrs Range #2 |
| control_flags (cache_dsb, write_thru_enb); | |
| control_flags (cache_enb, write_thru_enb); | |
| write (MEM, addr => x"40FF7E20",data_value => x"0000000000000000", byte_cnt => 8, next_request => 5); | Adrs Range #2 |
| - | |
| - | |
| write (MEM, addr => x"00FEAB0",data_value => x"344E28E3EC3A185E", byte_cnt => 8, next_request => 3); | Adrs Range #1 |
| control_flags (cache_dsb, write_thru_enb); | |
| read (IO, addr => x"000002BF",data_value => x"9E00000000000000", byte_cnt => 1, next_request => 4); | Adrs Range #4 |
| control_flags (cache_enb, write_thru_enb); | |
| control_flags (cache_dsb, write_thru_enb); | |
| read (MEM, addr => x"400E1052",data_value => x"00000000997E0000", byte_cnt => 1, next_request => 0); | Adrs Range #2 |
| read (MEM, addr => x"400E1053",data_value => x"00000000997E0000", byte_cnt => 1, next_request => 6); | Adrs Range #2 |
| read (MEM, addr => x"400E1053",data_value => x"00000000997E0000", byte_cnt => 1, next_request => 3); | Adrs Range #2 |
| read (MEM, addr => x"400E1054",data_value => x"00000000997E0000", byte_cnt => 1, next_request => 0); | Adrs Range #2 |
| control_flags (cache_enb, write_thru_enb); | |
| write (MEM, addr => x"001FEB60",data_value => x"70ACA6D42F9B9DB3", byte_cnt => 8, next_request => 0); | Adrs Range #1 |
| write (MEM, addr => x"001FEB68",data_value => x"B21E3D8691F5EB70", byte_cnt => 8, next_request => 8); | Adrs Range #1 |
| write (MEM, addr => x"001FEB70",data_value => x"7A66CB9FD622468A", byte_cnt => 8, next_request => 5); | Adrs Range #1 |
| write (MEM, addr => x"001FEB78",data_value => x"93FDE5E18EAB5CA0", byte_cnt => 8, next_request => 3); | Adrs Range #1 |
| control_flags (cache_dsb, write_thru_enb); | |
| read (MEM, addr => x"401210F5",data_value => x"28A3200000000000", byte_cnt => 1, next_request => 0); | Adrs Range #2 |
| read (MEM, addr => x"401210F6",data_value => x"28A3200000000000", byte_cnt => 1, next_request => 0); | Adrs Range #2 |
| read (MEM, addr => x"401210F7",data_value => x"28A3200000000000", byte_cnt => 1, next_request => 0); | Adrs Range #2 |
| read (MEM, addr => x"401210F7",data_value => x"28A3200000000000", byte_cnt => 1, next_request => 3); | Adrs Range #2 |
| control_flags (cache_enb, write_thru_enb); | |
| write (IO, addr => x"00000CF8",data_value => x"0000000080001044", byte_cnt => 4); | Alt. Data Stream: IDE |
| write (IO, addr => x"00000CFC",data_value => x"0000000004140018", byte_cnt => 4 , align_data); | Alt. Data Stream: IDE |
| (More operations HERE) | |
| printf("      Total Random Transfers Performed = 40"); | |
| HALT; | |
| sleep (0); | |
| end: | |
| ESR: INQUIRE | |
| begin | |
| INQ_RESULT (miss); | |
| end; | |
| ESR: INTR | |
| begin | |
| write (IO, addr => x"A0",data_value => x"20",byte_cnt => 1, align_data); | |
| write (IO, addr => x"A1",data_value => x"BF",byte_cnt => 1, align_data); | |
| write (IO, addr => x"20",data_value => x"20",byte_cnt => 1, align_data); | |
| write (IO, addr => x"21",data_value => x"FB",byte_cnt => 1, align_data); | |
| end; | |

What is claimed is:

1. A computer-implemented method of generating simulation code, the method comprising:

in response to a request by a program generator for an address constraint, receiving the address constraint, the address constraint designating a collection of addresses at an interface of a simulation model;

generating a data transfer instruction, said data transfer instruction comprising a data transfer address selected from the collection of addresses; and appending the data transfer instruction to a file associated with a Bus Functional Model (BFM).

2. The method of claim 1 wherein processing of a data transfer instruction by a simulation model produces a transfer of data from the simulation model to a second simulation model.

3. The method of claim 1 wherein the address constraint comprises a collection of address ranges.

4. The method of claim 1 wherein:

the address constraint further comprises address range probability data designating probability of selection of each address range;

selection of a data transfer address from the collection of addresses comprises selecting a first address range from the collection of address ranges and selecting an address in the first address range.

5. The method of claim 1 further comprising:
generating a data retrieval instruction, said data retrieval instruction comprising a data retrieval address selected from the collection of addresses;
and wherein a simulation model processing a data retrieval instruction simulates a bus transfer command effecting a data transfer from a second simulation model to the simulation model.

6. A computer-implemented simulation method, the method comprising:
in response to a request by a program generator for address constraint information, receiving address range constraint information from a user;
generating a collection of simulation model data output instructions, each data output instruction comprising a destination address at an interface of the model;
generating a collection of simulation model data input instructions, each data input instructions comprising a transfer address accessible at the interface of the model; and
appending the collection of simulation model data output instructions and the collection of simulation data input instructions to a file associated with a Bus Functional Model (BFM).

7. The method of claim 6 wherein the data output instructions and the data input instructions are interspersed.

8. The method of claim 6 wherein each transfer addresses matches a destination address of a generated data output instruction.

9. A computer program residing on a computer-readable medium, comprising instructions for causing a computer to:
request a user to provide address constraint information, the address constraint information designating a collection of addresses at an interface of a simulation model;
generate a collection of simulation model data transfer instructions, each data transfer instruction comprising a data transfer address selected from the collection of addresses; and
append the collection of simulation model data transfer instructions to a file associated with a Bus Functional Model (BFM).

10. The computer program of claim 9 further comprising instructions for causing the computer to generate a collection of data retrieval instructions, each data retrieval instruction comprising a data retrieval address selected from the collection of addresses.

11. A system comprising:
means for requesting a user to provide address constraint information delimiting a collection of data transfer address values; and
means for generating a collection of simulation data transfer instructions, each data transfer instruction comprising an address selected from the collection of data transfer address values; and
means for appending the collection of simulation model data transfer instructions to a file associated with a Bus Functional Model (BFM).

12. The system of claim 11 wherein the address range constraint comprises a collection of address ranges, each address range bounded by a minimum and a maximum value.

13. The system of claim 11 wherein the address range constraint further comprises address range probability data, and wherein the means for generating comprises means for selecting an address from the collection based on the address range probability data.

14. The system of claim 11 further comprising means for receiving a bus transaction constraint, the bus transaction constraint designating a minimum and a maximum number of bytes that a simulation model can transfer in bus data transfer transaction.

15. The system of claim 11 further comprising:
means for receiving a collection of device constraints, the device constraints designating data transfer characteristics of a simulated device;
and wherein the means for generating comprises means for generating in accordance with the device constraints.

16. A computer-implemented method of generating simulation code, the method comprising:
receiving an address constraint, the address constraint designating a collection of addresses at an interface of a simulation model;
automatically generating, in response to a user request, a data transfer instruction, said data transfer instruction comprising a data transfer address selected from- the collection of addresses; and
appending the data transfer instruction to a file associated with a Bus Functional Model (BFM).

17. The method of claim 16, wherein processing of a data transfer instruction by a simulation model produces a transfer of data from the simulation model to a second simulation model.

18. The method of claim 16, wherein the address constraint comprises a collection of address ranges.

19. The method of claim 16 wherein:
the address constraint further comprises address range probability data designating probability of selection of each address range; and
selection of a data transfer address from the collection of addresses comprises selecting a first address range from the collection of address ranges and selecting an address in the first address range.

20. The method of claim 16 further comprising:
generating a data retrieval instruction, said data retrieval instruction comprising a data retrieval address selected from the collection of addresses; and wherein a simulation model processing a data retrieval instruction simulates a bus transfer command effecting a data transfer from a second simulation model to the simulation model.

21. A computer-implemented method of generating simulation code, the method comprising:
receiving constraint parameters from a user;
initializing code generator data structures that control code execution;
initializing a device under test;
determining a statement type from a plurality of instruction types;
generating at least one data transfer instruction based at least in part on the constraint parameters and the statement type; and
appending the data transfer instruction to a language file associated with a Bus Functional Model (BFM).

22. The method of claim 21, wherein determining the statement type comprises randomly determining the statement type from the plurality of instruction types.

23. The method of claim 21, wherein the plurality of instruction types comprises:
- a write statement;
- a read statement; and
- an alternate data stream statement.

24. The method of claim 23, wherein a predetermined series of instructions are appended to the language file if the instruction type is the alternate data stream statement.

25. The method of claim 21, further comprising generating a history table storing an address and a data value if the instruction type is a write statement.

26. The method of claim 25, wherein a read address is selected from the history table if the instruction type is a read statement.

27. The method of claim 21, further comprising preloading cache locations of the BFM prior to initializing the device under test.

* * * * *